United States Patent
Ogawa et al.

(10) Patent No.: US 12,148,712 B2
(45) Date of Patent: Nov. 19, 2024

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Kazuya Ogawa, Tokyo (JP); Tsuyoshi Osaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 718 days.

(21) Appl. No.: 17/275,165

(22) PCT Filed: Nov. 20, 2018

(86) PCT No.: PCT/JP2018/042801
§ 371 (c)(1),
(2) Date: Mar. 10, 2021

(87) PCT Pub. No.: WO2020/105113
PCT Pub. Date: May 28, 2020

(65) Prior Publication Data
US 2022/0045018 A1    Feb. 10, 2022

(51) Int. Cl.
*H01L 27/14* (2006.01)
*H01L 21/66* (2006.01)
(Continued)

(52) U.S. Cl.
CPC ............ *H01L 23/562* (2013.01); *H01L 21/78* (2013.01); *H01L 22/32* (2013.01); *H01L 22/34* (2013.01);
(Continued)

(58) Field of Classification Search
CPC ................. H01L 22/34; H01L 2224/06181
See application file for complete search history.

(56) References Cited

U.S. PATENT DOCUMENTS

| | | | |
|---|---|---|---|
| 2005/0212147 A1* | 9/2005 | Nishizawa | ............. H01L 22/32 257/786 |
| 2014/0346509 A1* | 11/2014 | Zundel | .................... H01L 22/34 438/10 |
| 2018/0308973 A1 | 10/2018 | Ebiike et al. | |

FOREIGN PATENT DOCUMENTS

| | | |
|---|---|---|
| CN | 104183578 A | 12/2014 |
| DE | 10 2014 107 003 A1 | 11/2014 |

(Continued)

OTHER PUBLICATIONS

An Office Action; "Notice of Reasons for Refusal", mailed by the Japanese Patent Office on Dec. 7, 2021, which corresponds to Japanese Patent Application No. 2020-557061 and is related to U.S. Appl. No. 17/275,165; with English language translation.

(Continued)

*Primary Examiner* — Anthony Ho
*Assistant Examiner* — David J Goodwin
(74) *Attorney, Agent, or Firm* — Studebaker & Brackett PC

(57) ABSTRACT

An object is to provide a semiconductor device in which the area of inspection wiring for detecting chipping, cracks, or the like is narrowed. The semiconductor device includes a semiconductor substrate including an effective region including a semiconductor element and an ineffective region provided on a circumference of the effective region on a front surface thereof, and a rear surface electrode on a rear surface thereof; and inspection wiring provided in the ineffective region on the front surface of the semiconductor substrate so as to surround an outer periphery of the effective region. The inspection wiring is electrically connected to the rear surface electrode in such a manner that one end of the inspection wiring is in contact with the semiconductor layer which is provided in the ineffective region on the front (Continued)

surface of the semiconductor substrate and electrically connected to the rear surface electrode.

22 Claims, 16 Drawing Sheets

(51) Int. Cl.
  *H01L 21/78*  (2006.01)
  *H01L 23/00*  (2006.01)
  *H01L 23/58*  (2006.01)
  *H01L 29/739*  (2006.01)

(52) U.S. Cl.
  CPC ........ H01L 23/585 (2013.01); H01L 29/7393 (2013.01)

(56) References Cited

FOREIGN PATENT DOCUMENTS

| JP | S6376340 A | 4/1988 |
| JP | H103209874 A | 9/1991 |
| JP | 2000114516 A | 4/2000 |
| JP | 2005277338 A | 10/2005 |
| JP | 2010092924 A | 4/2010 |

OTHER PUBLICATIONS

International Search Report issued in PCT/JP2018/042801; mailed Feb. 12, 2019.

An Office Action mailed by China National Intellectual Property Administration on Sep. 2, 2023, which corresponds to Chinese Patent Application No. 201880099521.3 and is related to U.S. Appl. No. 17/275,165; with English language translation.

An Office Action issued by the German Patent and Trademark Office on Oct. 13, 2023, which corresponds to German Patent Application No. 112018008153.2 and is related to U.S. Appl. No. 17/275,165; with English language translation.

An Office Action mailed by China National Intellectual Property Administration on Apr. 27, 2024, which corresponds to Chinese Patent Application No. 201880099521.3 and is related to U.S. Appl. No. 17/275,165; with English language translation.

* cited by examiner

F I G. 4
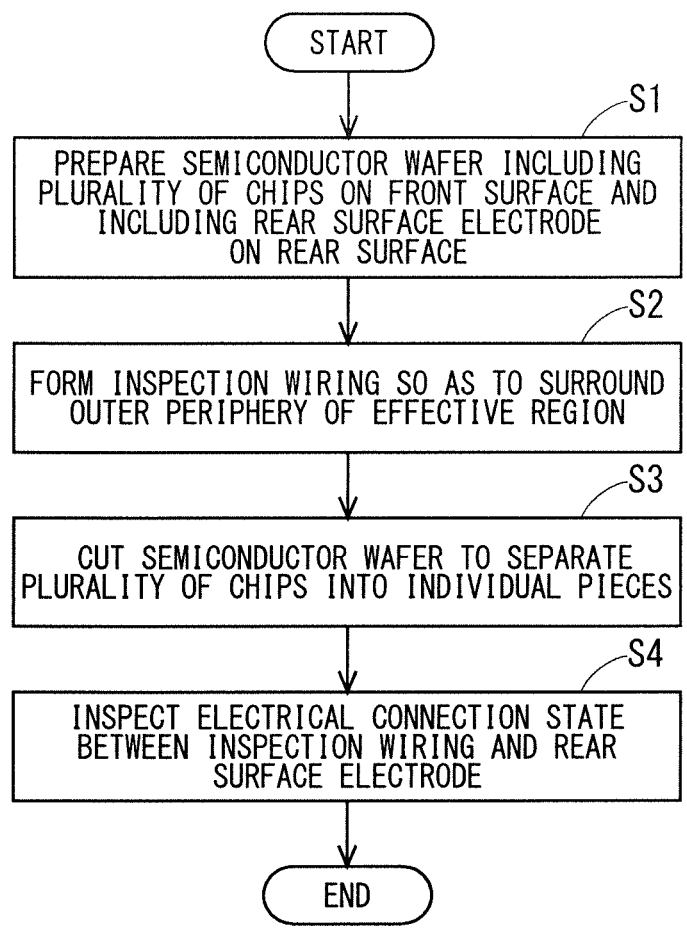

F I G. 7
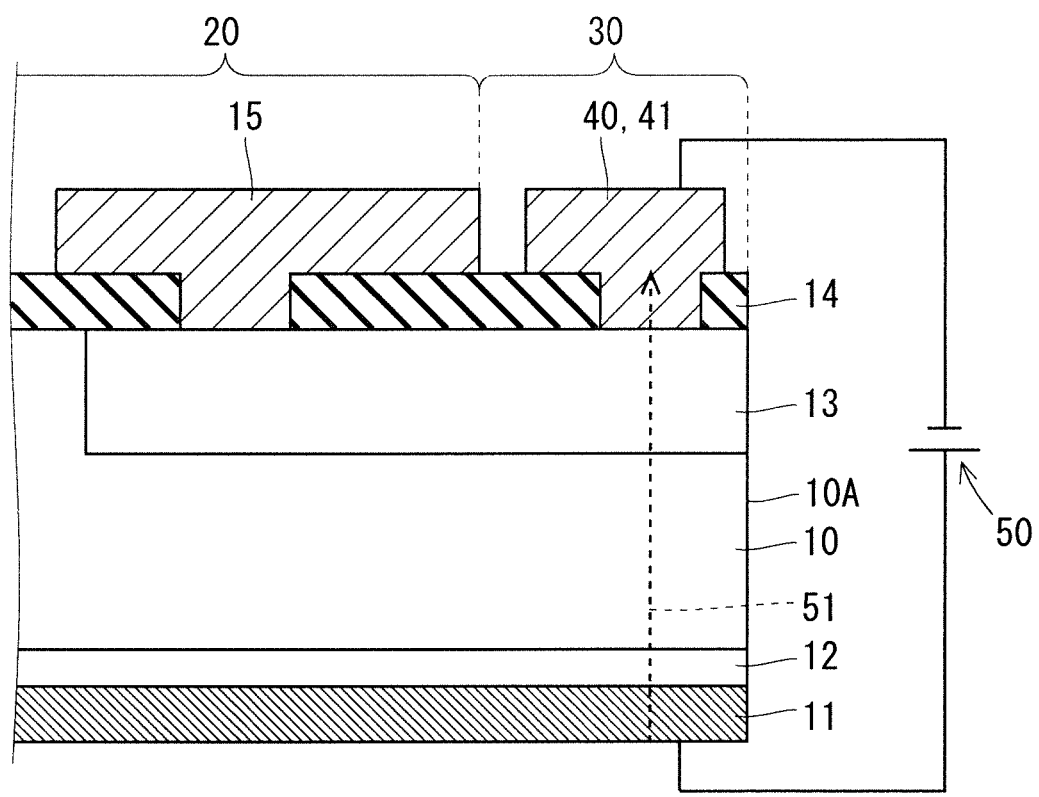

F I G. 1 1
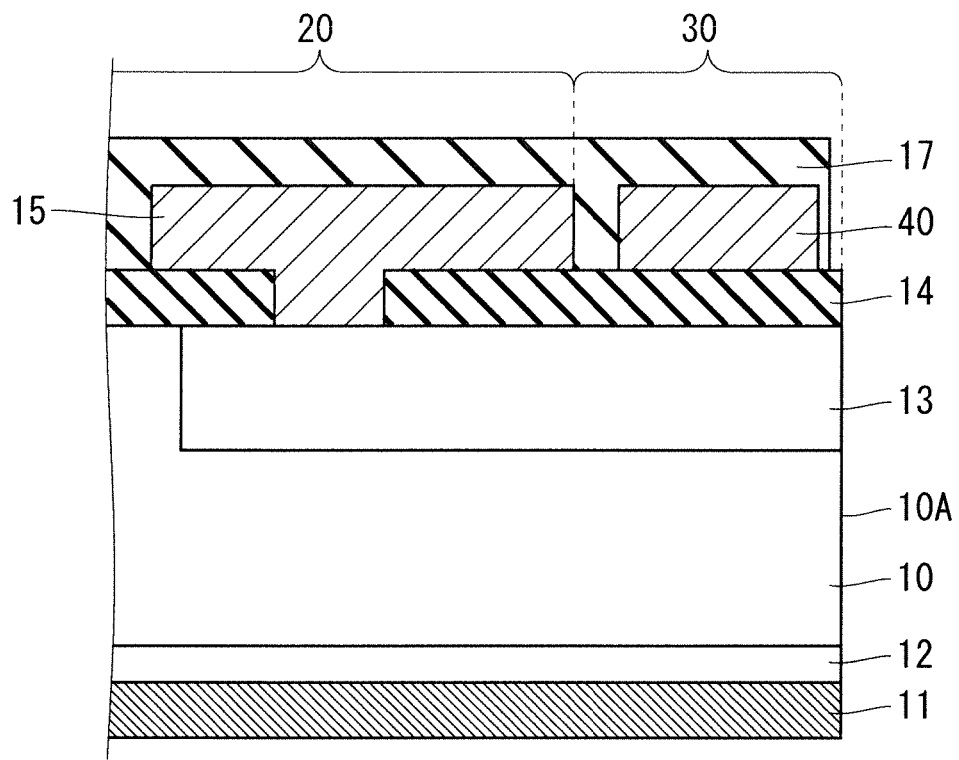

F I G. 1 5
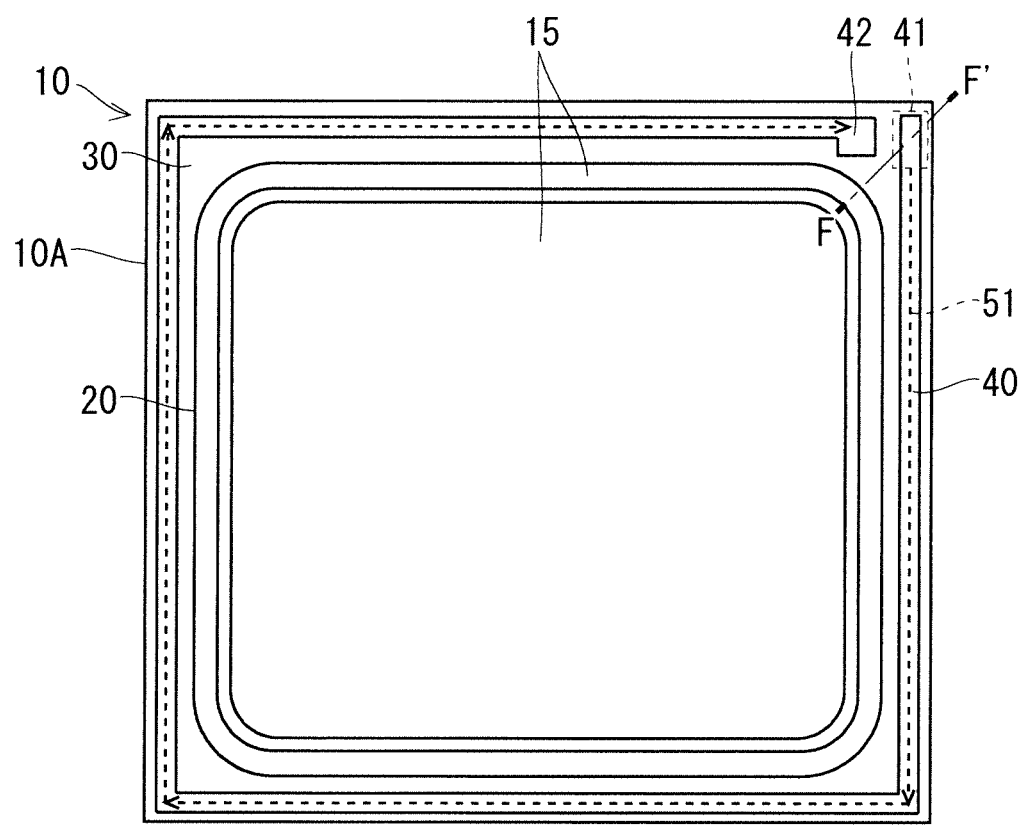

SEMICONDUCTOR DEVICE AND METHOD OF MANUFACTURING SEMICONDUCTOR DEVICE

TECHNICAL FIELD

The present invention relates to a semiconductor device and a method of manufacturing the semiconductor device.

BACKGROUND ART

In the manufacturing process of a power chip including an IGBT (Insulated Gate Bipolar Transistor), a diode and the like, a plurality of power chips formed in a matrix on a wafer are separated into individual power chips by cutting along a dicing line. In the dicing process, chipping or cracking occur on the power chip in some cases. Conventionally, in order to detect chipping and cracking, a visual inspection using an optical microscope has been conducted after dicing.

However, as a wafer diameter increases, the inspection time takes longer, which makes the total inspection of the power chips difficult to conduct due to the limited time to be spent in the inspection process. Further, even though chipping or cracking has occurred, the optical microscope may fail to detect the crack or chipping due to its limited ability in resolving power.

Patent Document 1 discloses a semiconductor device in which a crack, occurred after dicing, is detectable and a method of inspecting the semiconductor device. Inspection wiring is provided on the outer periphery of the chip region of the semiconductor device. According to the inspection method, cracks generated during dicing are detectable by measuring the resistance value of the inspection wiring.

PRIOR ART DOCUMENTS

Patent Documents

[Patent Document 1] Japanese Patent Application Laid-Open No. 2005-277338

SUMMARY

Problem to be Solved by the Invention

In a power chip in which a current flows from the front surface of the chip to the back surface of the chip, it is preferable that the area of an effective region, which is a region in which the current related to the switching operation flows, is large. This is because the larger the area of the effective region, the smaller the loss during energization.

The inspection wiring as described in Patent Document 1 is provided in an ineffective region existing on the circumference of the effective region. The ineffective region is a region in which the current related to the switching operation of the power chip does not flow. In a power chip having inspection wiring, the area of the ineffective region increases in accordance with the area of the inspection wiring and an inspection pad connected to the inspection wiring. When the area of the effective region is maintained to reduce the loss of the power chip, the chip size increases in accordance with the increase in the area of the ineffective region due to the arrangement of the inspection wiring.

The present invention has been made to solve the above problem, and an object of the present invention is to provide a semiconductor device in which the area of inspection wiring for detecting chipping, cracks, or the like is narrowed.

Means to Solve the Problem

According to the present invention, a semiconductor device includes a semiconductor substrate including an effective region including a semiconductor element and an ineffective region provided on a circumference of the effective region on a front surface thereof and a rear surface electrode on a rear surface thereof; and inspection wiring provided in the ineffective region on the front surface of the semiconductor substrate so as to surround an outer periphery of the effective region. The inspection wiring is electrically connected to the rear surface electrode in such a manner that one end of the inspection wiring is in contact with a semiconductor layer which is provided in the ineffective region on the front surface of the semiconductor substrate and electrically connected to the rear surface electrode.

Effects of the Invention

According to the present invention, a semiconductor device in which the area of inspection wiring for detecting chipping, cracks, or the like is narrowed is provided.

The explicit purpose, feature, phase, and advantage of the present invention will be described in detail hereunder with attached drawings.

BRIEF DESCRIPTION OF DRAWINGS

FIG. 4 A flowchart illustrating a method of manufacturing the semiconductor device according to Embodiment 1.

FIG. 7 A diagram illustrating a state in which a voltage is applied between the inspection wiring and the rear surface electrode.

FIG. 11 A cross-sectional view illustrating the configuration of the semiconductor device taken along line D-D' of FIG. 10.

FIG. 15 A plan view illustrating a configuration of a semiconductor device according to Embodiment 4.

DESCRIPTION OF EMBODIMENTS

Embodiment 1

Figure 1:
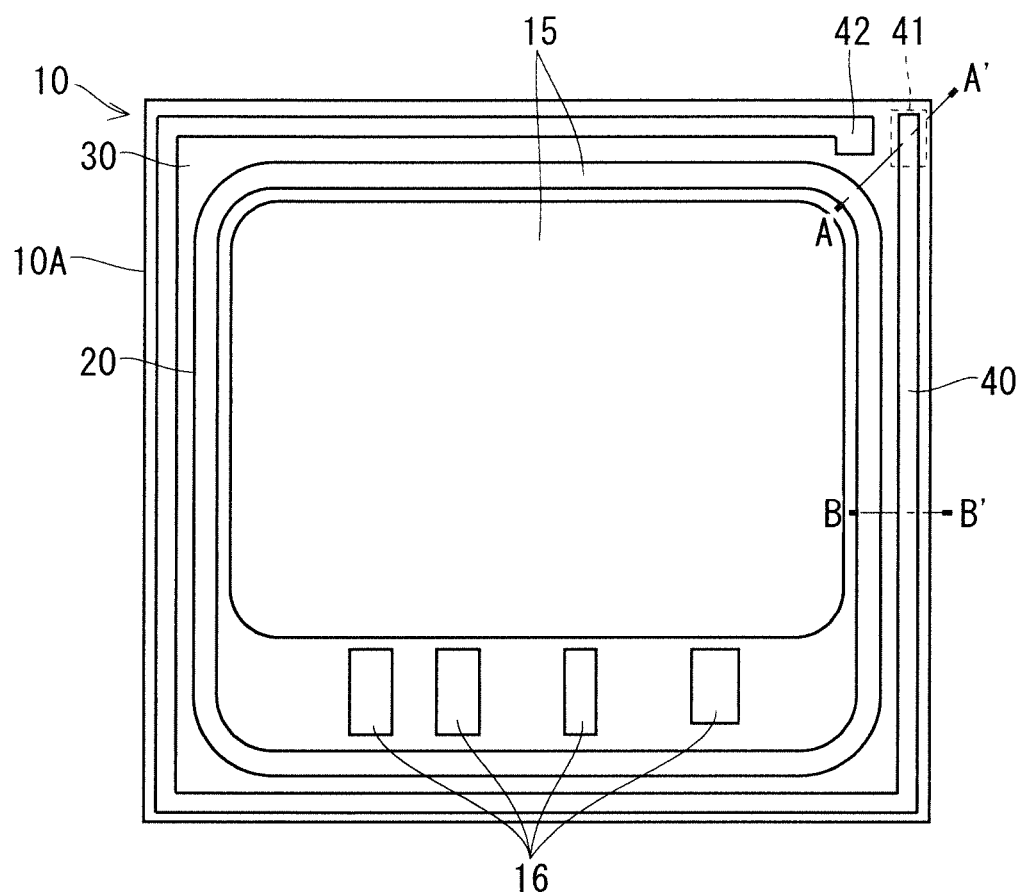
FIG. 1 A plan view illustrating a configuration of a semiconductor device according to Embodiment 1.
Figure 2:
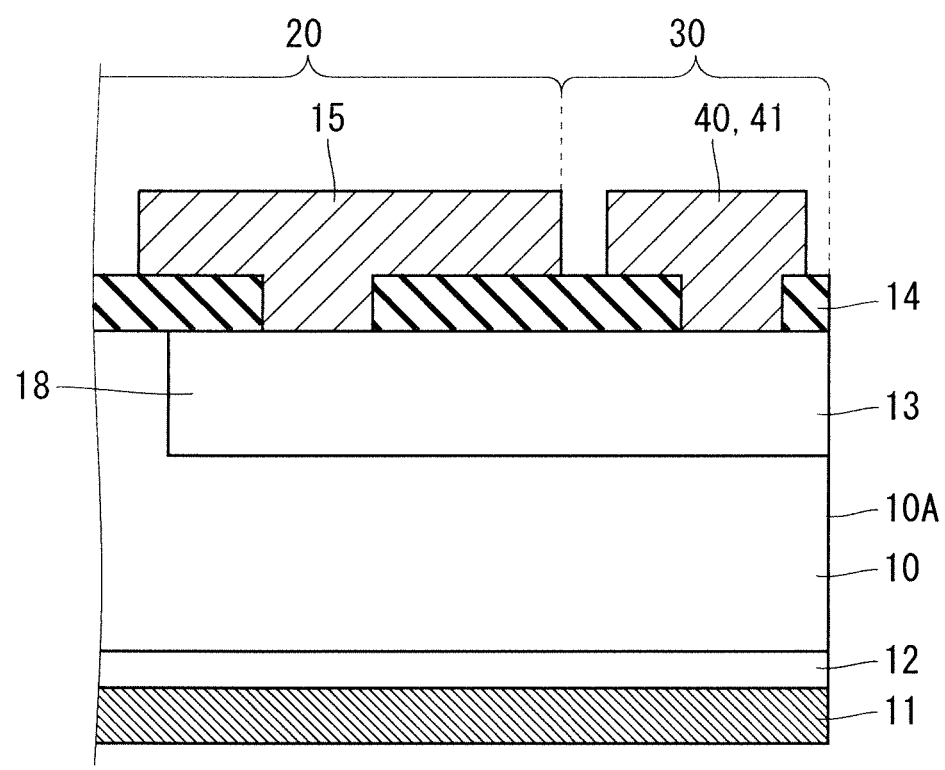
FIG. 2 A cross-sectional view illustrating the configuration of the semiconductor device taken along line A-A' of FIG. 1.
Figure 3:
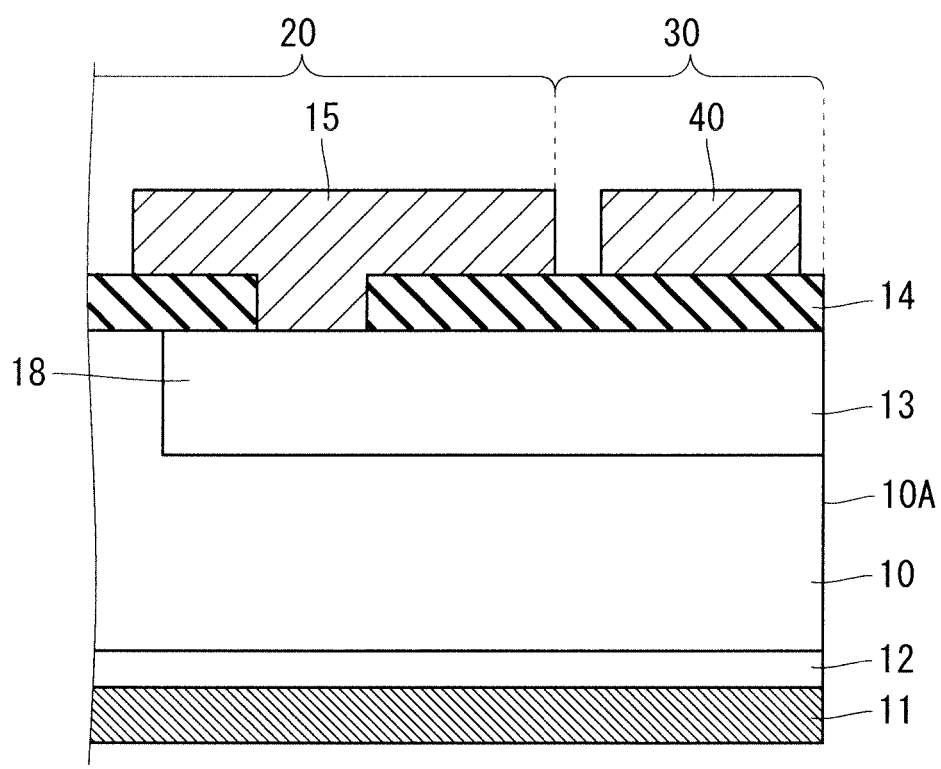
FIG. 3 A cross-sectional view illustrating the configuration of the semiconductor device taken along line B-B' of FIG. 1.

FIG. 1 is a plan view illustrating a configuration of a semiconductor device according to Embodiment 1. FIG. 2 is a cross-sectional view illustrating the configuration of the semiconductor device taken along line A-A' of FIG. 1. FIG. 3 is a cross-sectional view illustrating the configuration of the semiconductor device taken along line B-B' of FIG. 1. The semiconductor device is composed of a semiconductor substrate 10 and inspection wiring 40.

The semiconductor substrate 10 includes an effective region 20 and an ineffective region 30. The ineffective region 30 is provided on the circumference of the effective region 20. The semiconductor substrate 10 includes a semiconductor element (not illustrated) in the effective region 20 on the front surface of the semiconductor substrate 10. Further, the effective region 20 on the front surface of the semiconductor substrate 10 is provided with main wiring 15 and signal pads 16 for driving the semiconductor element. The main wiring 15 and the signal pads 16 are electrically connected to the semiconductor element in the effective region 20.

The semiconductor element includes, for example, an Insulated Gate Bipolar Transistor (IGBT) and a Metal-Oxide-Semiconductor Field-Effect Transistor (MOSFET). The semiconductor substrate 10 contains Si or SiC. In Embodiment 1, the semiconductor device is a power chip and switches the current flowing between a rear surface electrode and a front surface electrode, which will be described later. Here, the front surface electrode corresponds to the main wiring 15. The above effective region 20 corresponds to a region in which a current flows from the front surface to the rear surface of the semiconductor substrate 10 in response to the switching operation of the semiconductor element.

As illustrated in FIG. 2, the semiconductor substrate 10 includes a p-type semiconductor layer 12 on the rear surface thereof and a rear surface electrode 11 provided on the p-type semiconductor layer 12. The rear surface electrode 11 has a structure in which AlSi, Ti, Ni, Au, etc. are laminated, for example. For example, when the semiconductor element is an IGBT and the main wiring 15 is connected to an emitter electrode, the rear surface electrode 11 is a collector electrode. For example, when the semiconductor element is a MOSFET and the main wiring 15 is connected to a source electrode, the rear surface electrode 11 is a drain electrode.

The semiconductor substrate 10 includes an n-type semiconductor layer 13 in the ineffective region 30 on the front surface of the semiconductor substrate 10. The n-type semiconductor layer 13 is electrically connected to the rear surface electrode 11 via the p-type semiconductor layer 12. In Embodiment 1, the n-type semiconductor layer 13 is a layer extending from a channel stopper 18 provided on the outer periphery of the effective region 20. Further, an insulating layer 14 is laminated on the n-type semiconductor layer 13 and the channel stopper 18. The insulating layer 14 is, for example, an oxide film. The main wiring 15 and the channel stopper 18 are in contact with each other at the opening of the insulating layer 14 in the effective region 20.

As illustrated in FIG. 1, the inspection wiring 40 is provided in the ineffective region 30 on the front surface of the semiconductor substrate 10 so as to surround the outer periphery of the effective region 20. The inspection wiring 40 is provided between the outer periphery of the effective region 20 and the outer edge portion 10A of the semiconductor substrate 10. The outer edge portion 10A corresponds to a dicing line defined in the ineffective region 30 described later. Therefore, it can be said that the inspection wiring 40 is arranged between the channel stopper 18 and the dicing line.

As illustrated in FIG. 2, one end 41 of the inspection wiring 40 is in contact with the n-type semiconductor layer 13 at the opening of the insulating layer 14 in the ineffective region 30. The inspection wiring 40 is electrically connected to the rear surface electrode 11 via the one end 41 thereof and the n-type semiconductor layer 13. Further, as illustrated in FIG. 3, the inspection wiring 40 other than the one end 41 is insulated from the n-type semiconductor layer 13 by the insulating layer 14.

Further, the inspection wiring 40 includes an inspection pad 42 at the other end as illustrated in FIG. 1. The width of the inspection pad 42 is wider than the width of the wiring body extending from the one end 41 to the other end. The inspection wiring 40 contains aluminum, for example.

FIG. 4 is a flowchart illustrating a method of manufacturing the semiconductor device according to Embodiment 1.

Figure 5:
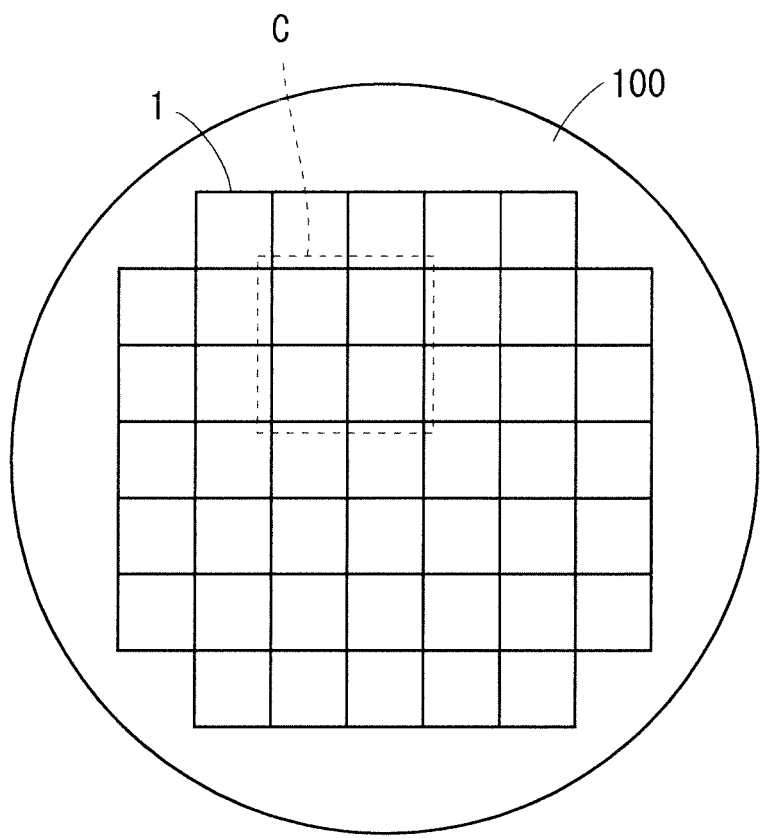
FIG. 5 A diagram illustrating a configuration of a semiconductor wafer according to Embodiment 1.
Figure 6:
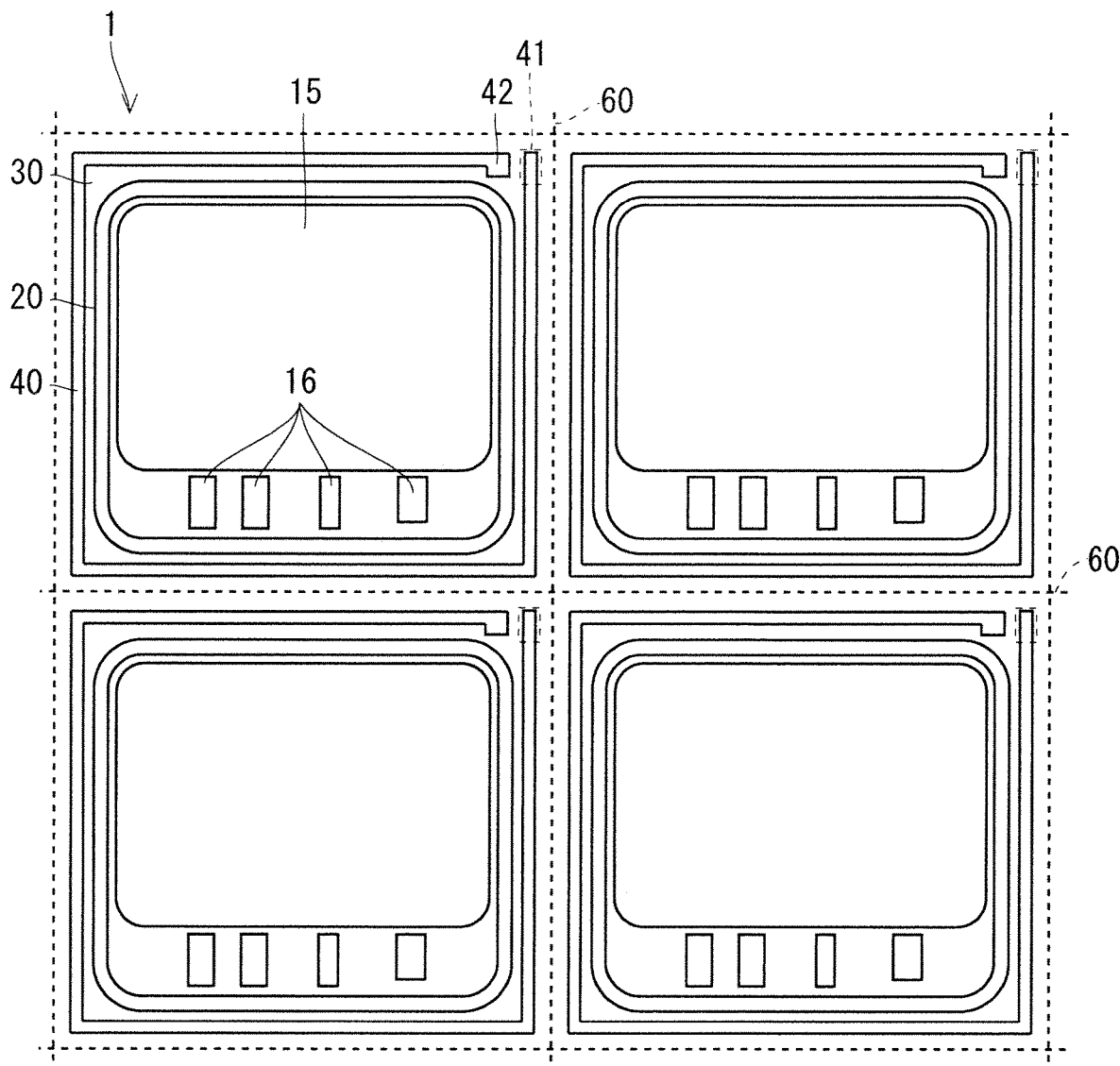
FIG. 6 an enlarged view of a region C illustrated in FIG. 5.

In Step S1, a semiconductor wafer including a plurality of chips on the front surface and the rear surface electrode 11 on the rear surface is prepared. FIG. 5 is a diagram illustrating a configuration of the semiconductor wafer 100 according to Embodiment 1. The plurality of chips 1 are arranged in a matrix on the front surface of the semiconductor wafer 100. FIG. 6 is an enlarged view of a region C illustrated in FIG. 5. Each of the plurality of chips 1 includes the effective region 20 including the semiconductor element and the ineffective region 30 provided on the circumference of the effective region 20. Further, although not illustrated, the semiconductor wafer 100 includes the rear surface electrode 11 on the rear surface thereof. The configuration of the semiconductor wafer 100 is similar to the configuration of the semiconductor substrate 10 described above, and the semiconductor wafer 100 in a state where a plurality of chips 1 are separated into individual pieces in the process described later corresponds to the semiconductor substrate 10 described above.

In Step S2, the inspection wiring 40 is formed so as to surround the outer periphery of the effective region 20 (see FIG. 6). The inspection wiring 40 is formed so that the one end 41 contacts the n-type semiconductor layer 13 provided in the ineffective region 30 on the front surface of the semiconductor wafer 100.

In Step S3, the semiconductor wafer 100 is cut and the plurality of chips 1 are separated into individual pieces. At this time, the semiconductor wafer 100 is cut along the dicing line 60. The dicing line 60 is defined in the ineffective region 30 between chips 1 adjacent to each other and located outside the inspection wiring 40 with respect to the effective region 20. The dicing line 60 after the plurality of chips 1 are separated into individual pieces corresponds to the outer edge portion 10A of the semiconductor substrate 10 in FIG. 1. That is, each of the chips 1 separated into the individual pieces corresponds to one semiconductor device.

Figure 8:
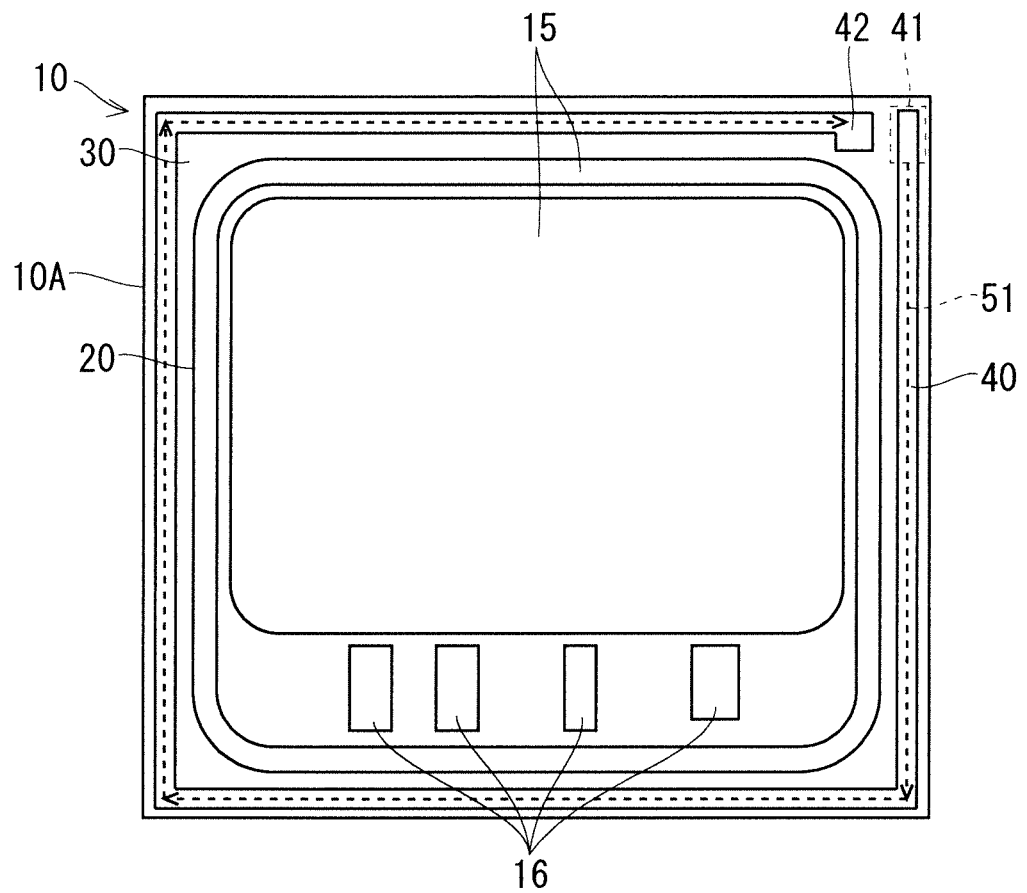
FIG. 8 A diagram illustrating a current path flowing from one end of the inspection wiring into the inspection pad.

In Step S4, the electrical connection state between the inspection wiring 40 and the rear surface electrode 11 is inspected. A voltage is applied, by a DC power supply 50, between the inspection wiring 40 and the rear surface electrode 11 in each of the plurality of chips 1. FIG. 7 is a diagram illustrating a state in which the voltage is applied between the inspection wiring 40 and the rear surface electrode 11. When the inspection wiring 40 is unbroken by any chipping and cracking, a current flows from the rear surface electrode 11 to the inspection pad 42 via the one end 41 of the inspection wiring 40. FIG. 8 is a diagram illustrating a current path 51 flowing from the one end 41 of the inspection wiring 40 into the inspection pad 42. When chipping or cracks has occurred the inspection wiring 40, the current value will fluctuate. Therefore, the inspection of the electrical connection state between the inspection wiring 40 and the rear surface electrode 11 is conducted by measuring the current value in the current path 51.

Summarizing the above, the semiconductor device according to Embodiment 1 includes the semiconductor substrate 10 and the inspection wiring 40. The semiconductor substrate 10 includes the effective region 20 including the semiconductor element and the ineffective region 30 provided on the circumference of the effective region 20 on the front surface thereof, and includes the rear surface electrode 11 on the rear surface thereof. The inspection wiring 40 is provided in the ineffective region 30 on the front surface of the semiconductor substrate 10 so as to surround the outer periphery of the effective region 20. The inspection wiring 40 is electrically connected to the rear surface electrode 11 in such a manner that the one end 41 of the inspection wiring 40 is in contact with the semiconductor layer which is provided in the ineffective region 30 on the front surface of the semiconductor substrate 10 and electrically connected to the rear surface electrode 11. In Embodiment 1, the semiconductor layer is the n-type semiconductor layer 13.

Such a semiconductor device ensures to detect chipping, cracks, or the like by measuring the current flowing from the rear surface electrode 11 to the inspection wiring 40. A plurality of inspection pads for applying a voltage to the inspection wiring 40 are not required in the semiconductor device, which enables to narrow the area of the inspection wiring 40. Therefore, the area of the ineffective region 30 is narrowed while maintaining the area of the effective region 20. Therefore, the semiconductor device realizes cost reduction by reducing the chip size while reducing the loss at the time of energization. In addition, the semiconductor device enables to detect chipping or cracks on the dicing line, which are not detected by conventional withstand voltage measurement. Further, when the semiconductor substrate contains a wide bandgap semiconductor such as SiC, chipping or cracks is more likely to occur due to its high hardness. The semiconductor device described in Embodiment 1 is suitable for detecting chipping or cracks of a wide bandgap semiconductor.

Further, the inspection wiring 40 of the semiconductor device according to Embodiment 1 includes the inspection pad 42 at the other end thereof. The width of the inspection pad 42 is wider than the width of the wiring body extending from the one end 41 to the other end.

Such a semiconductor device does not require a plurality of inspection pads on the front surface thereof, enabling to narrow the area of the inspection wiring 40. When a voltage is applied between the one end and the other end of the inspection wiring instead of applying a voltage between the one end 41 of the inspection wiring 40 and the rear surface electrode 11, a plurality of inspection pads are required to be provided on the front surface of the semiconductor device. However, in Embodiment 1, a voltage is applied between the one end 41 of the inspection wiring 40 and the rear surface electrode 11; therefore, at least one inspection pad needs only be arranged on the front surface of the semiconductor device.

Further, the inspection wiring 40 of the semiconductor device according to Embodiment 1 contains aluminum.

In such a semiconductor device, forming of the inspection wiring 40 in the same manufacturing process as other aluminum wiring or an aluminum electrode layer included in the semiconductor device is ensured:

Further, the semiconductor element of the semiconductor device according to Embodiment 1 includes an IGBT, a MOSFET or a diode that controls a current flowing between the rear surface electrode 11 and the front surface electrode provided in the effective region 20 on the front surface of the semiconductor substrate 10. In Embodiment 1, the front surface electrode is the main wiring 15.

In such a semiconductor device, diverting the rear surface electrode 11 of the semiconductor element to the electrode for applying a voltage to the inspection wiring 40 is ensured.

Further, the method of manufacturing the semiconductor device according to Embodiment 1 includes preparing a semiconductor wafer 100 including the plurality of chips 1 arranged in a matrix on the front surface thereof, each of the plurality of chips 1 including the effective region 20 including the semiconductor element and the ineffective region 30 provided on the circumference of the effective region 20, the semiconductor wafer 100 including the rear surface electrode 11 on the rear surface thereof; forming inspection wiring 40 in the ineffective region 30 of the front surface of the semiconductor wafer 100 in such a manner that the one end 41 of the inspection wiring 40 is in contact with the semiconductor layer (n-type semiconductor layer 13) which is provided in the ineffective region 30 on the front surface of the semiconductor wafer 100 and electrically connected to the rear surface electrode 11, and so as to surround the outer periphery of the effective region 20; cutting the semiconductor wafer 100 along the dicing line 60 defined in the ineffective region 30 between the plurality of chips 1 adjacent to each other and outside of the inspection wiring 40 with respect to the effective region 20, thereby separating the plurality of chips 1 into individual pieces; and applying a voltage between the inspection wiring 40 and the rear surface electrode 11 of each of the plurality of chips 1 to detect a current flowing between the inspection wiring 40 and the rear surface electrode 11, thereby inspecting an electrical connection state between the inspection wiring 40 and the rear surface electrode 11.

The method of manufacturing such a semiconductor device ensures to detect chipping, cracks, or the like by measuring the current flowing from the rear surface electrode 11 to the inspection wiring 40 of the semiconductor device. Further, according to the method of manufacturing the semiconductor device, a plurality of inspection pads for applying a voltage to the inspection wiring 40 are not required in the semiconductor device, which enables to narrow the area of the inspection wiring 40. The area of the ineffective region 30 is narrowed while maintaining the area of the effective region 20. Therefore, the semiconductor device realizes cost reduction by reducing the chip size while reducing the loss at the time of energization.

Further, when the method of manufacturing the semiconductor device includes an inspection step in which current flows through the main wiring 15 and the rear surface electrode 11 for inspection of the semiconductor element, the method of manufacturing in Embodiment 1 can be performed simultaneously or continuously with the inspection step. At that point, by simply providing one probe pin for applying a voltage to the inspection wiring 40 on the front surface of the semiconductor device, the inspection device (not shown) can conduct the inspection described in Embodiment 1. The method of manufacturing the semiconductor device enables to detect chipping or cracks on the dicing line, which are not detected by conventional withstand voltage measurement.

Further, in the method of manufacturing of the semiconductor device according to Embodiment 1, the inspection wiring 40 includes the inspection pad 42 at the other end thereof. The width of the inspection pad 42 is wider than the width of the wiring body extending from the one end 41 to the other end. The inspection of the electrical connection condition between the inspection wiring 40 and the rear surface electrode 11 is conducted by applying a voltage between the inspection pad 42 and the rear surface electrode 11.

The method of manufacturing such a semiconductor device enables manufacturing of a semiconductor device in which the area of the inspection wiring 40 is narrowed. When a voltage is applied between the one end and the other end of the inspection wiring instead of applying a voltage between the one end 41 of the inspection wiring 40 and the rear surface electrode 11, a plurality of inspection pads are required to be provided on the front surface of the semiconductor device. However, in Embodiment 1, a voltage is applied between the one end 41 of the inspection wiring 40 and the rear surface electrode 11; therefore, at least one inspection pad needs only be arranged on the front surface of the semiconductor device.

Further, in the method of manufacturing of the semiconductor device according to Embodiment 1, the inspection wiring 40 is formed between the outer periphery of the effective region 20 and the dicing line 60.

The method of manufacturing such a semiconductor device can detect the occurrence of chipping, cracks, or the like on the outer periphery of the semiconductor substrate 10.

Further, in the method of manufacturing the semiconductor device according to Embodiment 1, the inspection wiring 40 contains aluminum.

In the method of manufacturing such a semiconductor device, forming of the inspection wiring 40 in the same manufacturing process as other aluminum wiring or an aluminum electrode layer (neither shown) included in the semiconductor device is ensured.

Further, in the method of manufacturing the semiconductor device according to Embodiment 1, the semiconductor element includes an IGBT, a MOSFET or a diode that controls a current flowing between the rear surface electrode 11 and the front surface electrode (main wiring 15) provided in the effective region 20 on the front surface of the semiconductor wafer 100.

In the method of manufacturing such a semiconductor device, diverting the rear surface electrode 11 of the semiconductor element to the electrode for applying a voltage to the inspection wiring 40 so as to perform the inspection for chipping or cracks is ensured.

Modification of Embodiment 1

Figure 9:
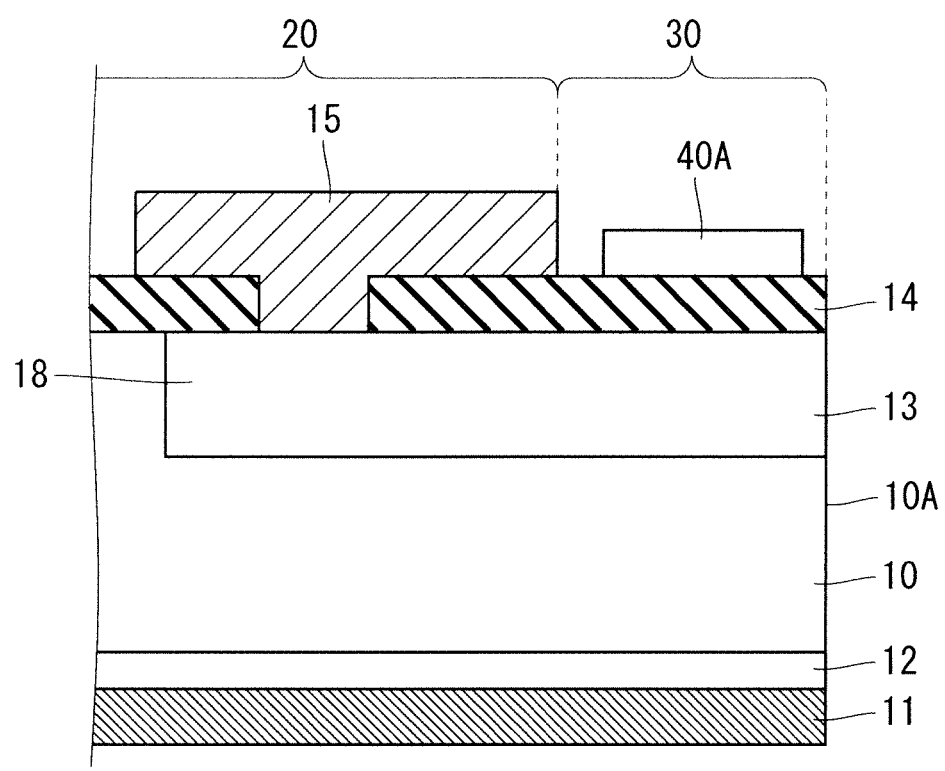
FIG. 9 A cross-sectional view illustrating a configuration of a semiconductor device according to Modification of Embodiment 1.

In the semiconductor device in Modification of Embodiment 1, the configuration other than the inspection wiring is the same as the configuration of Embodiment 1. FIG. 9 is a cross-sectional view illustrating a configuration of a semiconductor device according to Modification of Embodiment 1. FIG. 9 corresponds to a cross section taken along line B-B' in FIG. 1.

In Modification of Embodiment 1, the thickness of the inspection wiring 40A is thinner than the thickness of the main wiring 15. Such a semiconductor device improves the detection sensitivity for chipping or cracks.

The inspection wiring 40A contains polysilicon, for example. The polysilicon inspection wiring 40A facilitates the formation of inspection wiring thinner than, for example, the aluminum inspection wiring 40 described in Embodiment 1. As a result, the detection sensitivity for chipping or cracks improves.

Embodiment 2

A semiconductor device and a method of manufacturing a semiconductor device according to Embodiment 2 will be described. Note that the description of the same configurations and operations as in Embodiment 1 is omitted.

Figure 10:
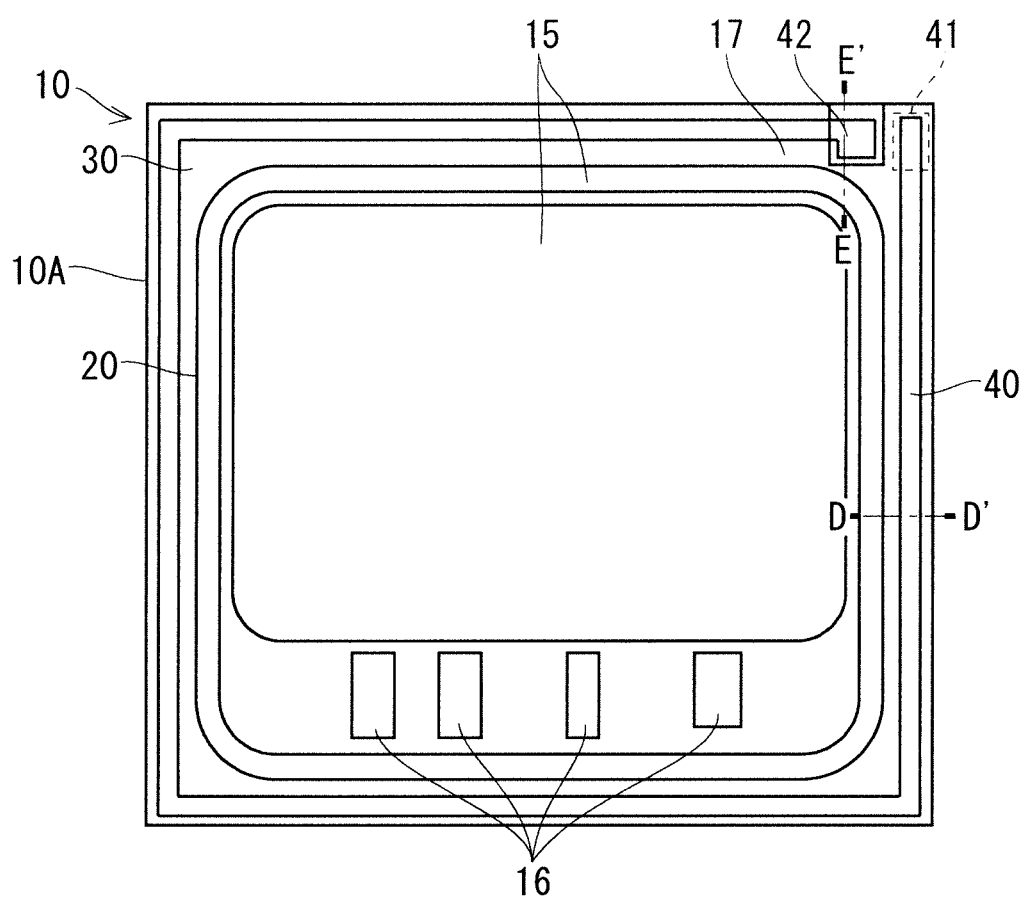
FIG. 10 A plan view illustrating a configuration of a semiconductor device according to Embodiment 2.
Figure 12:
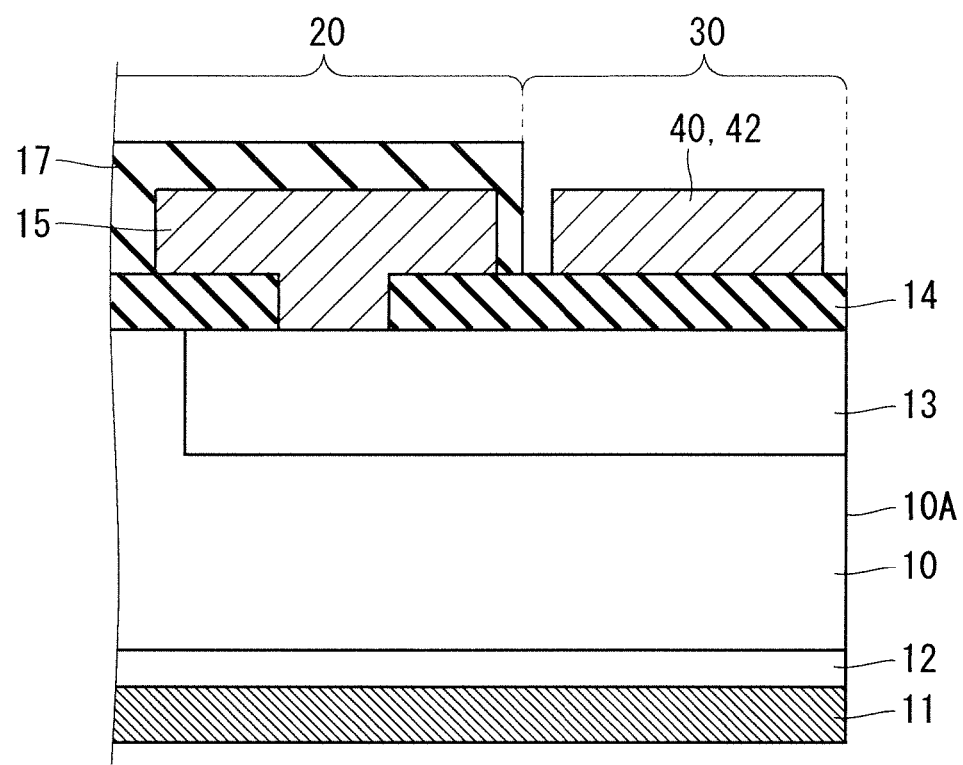
FIG. 12 A cross-sectional view illustrating the configuration of the semiconductor device taken along line E-E' of FIG. 10.

FIG. 10 is a plan view illustrating a configuration of a semiconductor device according to Embodiment 2. FIG. 11 is a cross-sectional view illustrating the configuration of the semiconductor device taken along line D-D' of FIG. 10. FIG. 12 is a cross-sectional view illustrating the configuration of the semiconductor device taken along line E-E' of FIG. 10.

The semiconductor device according to Embodiment 2 further includes a protective film 17 covering the inspection wiring 40 except for the inspection pad 42. The protective film 17 is formed between Steps S2 and S3 illustrated in FIG. 4.

The protective film 17 prevents scratches or foreign matter from adhering to the inspection wiring 40. Therefore, the semiconductor device ensures the accurate detection of chipping or cracks caused by dicing.

Embodiment 3

A semiconductor device and a method of manufacturing a semiconductor device according to Embodiment 3 will be described. Note that the description of the same configurations and operations as in Embodiment 1 or 2 is omitted. The semiconductor device according to Embodiment 3 differs from the semiconductor device according to Embodiment 1 in the configuration of an n-type semiconductor layer in contact with the one end 41 of the inspection wiring 40.

Figure 13:
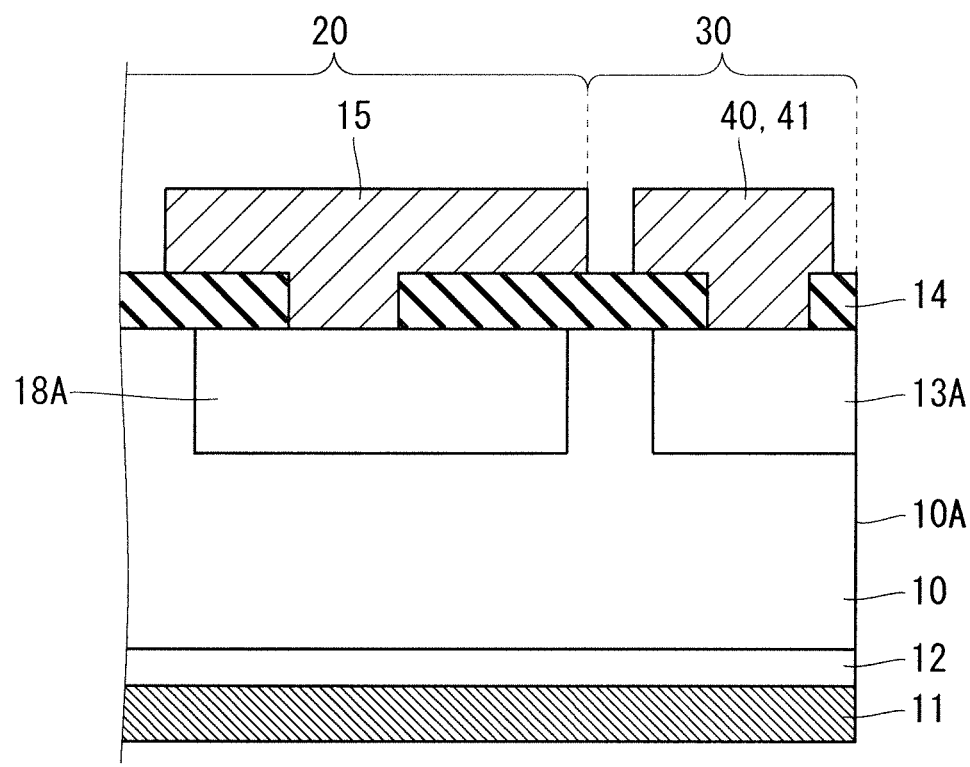
FIG. 13 A cross-sectional view illustrating a configuration of a semiconductor device according to Embodiment 3.
Figure 14:
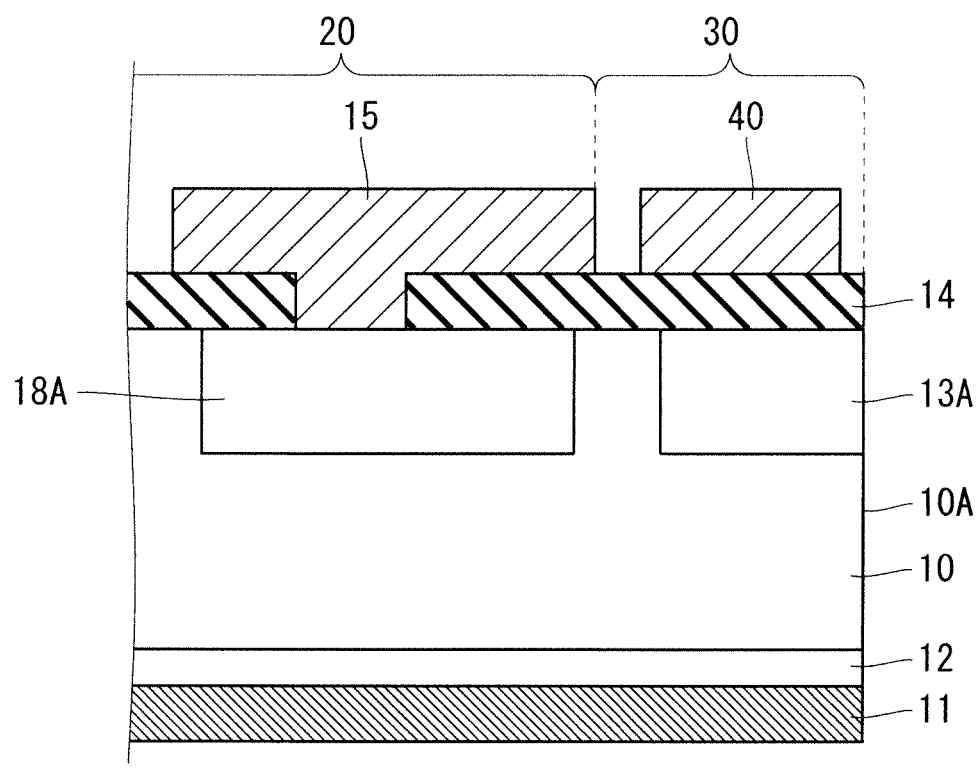
FIG. 14 A cross-sectional view illustrating the configuration of the semiconductor device according to Embodiment 3.

FIGS. 13 and 14 are cross-sectional views illustrating a configuration of a semiconductor device according to Embodiment 3. FIG. 13 corresponds to a cross section taken along line A-A' in FIG. 1. FIG. 14 corresponds to a cross section taken along line B-B' in FIG. 1.

In the semiconductor device according to Embodiment 3, an n-type semiconductor layer 13A in contact with the one end 41 of the inspection wiring 40 is separated from a channel stopper 18A provided on the outer periphery of the effective region 20. The n-type semiconductor layer 13A is provided closer to the outer edge portion 10A of the semiconductor substrate 10 than the channel stopper 18A is. The semiconductor wafer 100 including such a channel stopper 18A and an n-type semiconductor layer 13A is prepared in Step S1 illustrated in FIG. 4.

The inspection wiring 40 is provided between the channel stopper 18A and the outer edge portion 10A of the semiconductor substrate 10. The outer edge portion 10A corresponds to the dicing line 60 defined in the ineffective region 30. Such inspection wiring 40 is formed in Step S2 illustrated in FIG. 4.

The semiconductor device having the above configuration can detect the occurrence of chipping, cracks, or the like on the outer periphery of the semiconductor substrate 10. In the semiconductor device according to Embodiment 2, the n-type semiconductor layer 13 in contact with the one end 41 of the inspection wiring 40 may be separated from the channel stopper 18 provided on the outer periphery of the effective region 20. The same effect is exhibited.

Embodiment 4

A semiconductor device and a method of manufacturing a semiconductor device according to Embodiment 4 will be described. Note that the description of the same configurations and operations as in any of Embodiments 1 to 3 is omitted.

Figure 16:
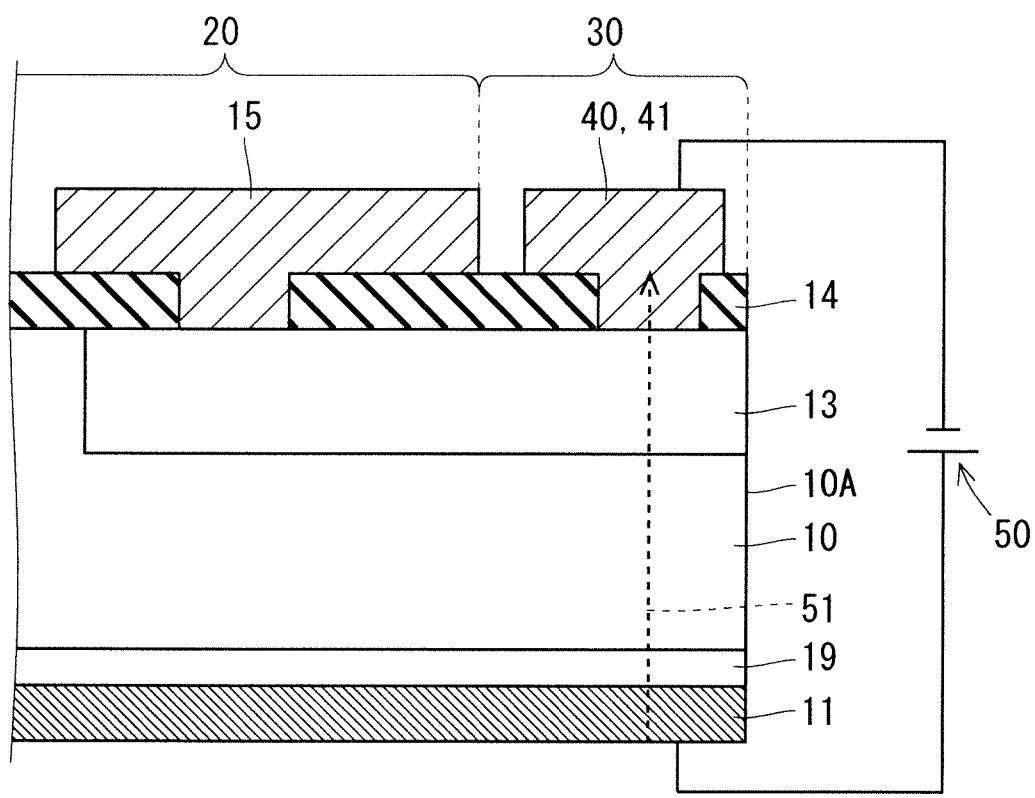
FIG. 16 A cross-sectional view illustrating the configuration of the semiconductor device taken along line F-F' of FIG. 15.

FIG. 15 is a plan view illustrating a configuration of a semiconductor device according to Embodiment 4. FIG. 16 is a cross-sectional view illustrating the configuration of the semiconductor device taken along line F-F' of FIG. 15. In addition, FIGS. 15 and 16 also illustrate the current path 51 flowing from the rear surface electrode 11 to the inspection pad 42 via the one end 41 of the inspection wiring 40.

In Embodiment 4, a semiconductor element included in the semiconductor device is a diode. The semiconductor substrate 10 includes an n-type semiconductor layer 19 on the rear surface thereof, and the rear surface electrode 11 is provided on the n-type semiconductor layer 19.

In Step S4 illustrated in FIG. 4, a voltage is applied between the inspection wiring 40 and the rear surface electrode 11 by a DC power supply 50, and a current flows from the rear surface electrode 11 to the inspection pad 42 via the one end 41 of the inspection wiring 40. The inspection of the electrical connection state between the inspection wiring 40 and the rear surface electrode 11 is conducted by detecting this current. Similar to the IGBT or MOSFET described in other Embodiments, chipping or cracks can be detected in the semiconductor device including a diode.

It should be noted that Embodiments of the present invention can be arbitrarily combined and can be appropriately modified or omitted without departing from the scope of the invention.

While the invention has been described in detail, the forgoing description is in all aspects illustrative and not restrictive. It is understood that numerous other modifications can be devised without departing from the scope of the invention.

EXPLANATION OF REFERENCE SIGNS 1 chip, 10 semiconductor substrate, 10A outer edge portion, 11 rear surface electrode, 13 n-type semiconductor layer, 15 main wiring, 16 signal pad, 17 protective film, 18 channel stopper, 19 n-type semiconductor layer, 20 effective region, 30 ineffective region, 40 inspection wiring, 41 one end, 42 inspection pad, 60 dicing line, 100 semiconductor wafer.

The invention claimed is:
1. A semiconductor device comprising:
a semiconductor substrate including an effective region including a semiconductor element and an ineffective region provided on a circumference of the effective region on a front surface of the semiconductor substrate, the semiconductor substrate including a rear surface electrode on a rear surface of the semiconductor substrate; and
inspection wiring provided in the ineffective region including a portion on and over the front surface of the semiconductor substrate so that the portion on and over the front surface surrounds an outer periphery of the effective region, wherein
the inspection wiring includes a first end portion that extends from the portion of the inspection wiring that is on and over the front surface and electrically connects to the rear surface electrode in such a manner that the first end portion of the inspection wiring is in contact with a semiconductor layer which is provided in the ineffective region on the front surface of the semiconductor substrate and electrically connected to the rear surface electrode.

2. The semiconductor device according to claim 1, wherein
the inspection wiring includes an inspection pad at a second end connected to a wiring body extending from the first end portion, and
a width of the inspection pad is wider than a width of the wiring body extending from the first end portion to the second end.

3. A semiconductor device comprising:
a semiconductor substrate including an effective region including a semiconductor element and an ineffective region provided on a circumference of the effective region on a front surface of the semiconductor substrate, the semiconductor substrate including a rear surface electrode on a rear surface of the semiconductor substrate; and
inspection wiring provided in the ineffective region on the front surface of the semiconductor substrate so as to surround an outer periphery of the effective region, wherein
the inspection wiring is electrically connected to the rear surface electrode in such a manner that a first end of the inspection wiring is in contact with a semiconductor layer which is provided in the ineffective region on the front surface of the semiconductor substrate and electrically connected to the rear surface electrode, and
the inspection wiring is provided between a channel stopper provided on the outer periphery of the effective region and an outer edge portion of the semiconductor substrate, and
the outer edge portion corresponds to a dicing line defined in the ineffective region.

4. The semiconductor device according to claim 1, wherein
a thickness of the inspection wiring is thinner than a thickness of wiring connected to the semiconductor element in the effective region.

5. The semiconductor device according to claim 1, wherein
the inspection wiring contains aluminum.

6. The semiconductor device according to claim 1, wherein
the inspection wiring contains polysilicon.

7. The semiconductor device according to claim 2, further comprising
a protective film covering the inspection wiring except for the inspection pad.

8. The semiconductor device according to claim 1, wherein
the semiconductor element includes an Insulated Gate Bipolar Transistor (IGBT), a Metal-Oxide-Semiconductor Field-Effect Transistor (MOSFET), or a diode configured to control a current flowing between the rear surface electrode and a front surface electrode provided in the effective region on the front surface of the semiconductor substrate.

9. The semiconductor device according to claim 3, wherein
the inspection wiring includes an inspection pad at a second end connected to a wiring body extending from the first end portion, and
a width of the inspection pad is wider than a width of the wiring body extending from the first end portion to the second end.

10. The semiconductor device according to claim 3, wherein
a thickness of the inspection wiring is thinner than a thickness of wiring connected to the semiconductor element in the effective region.

11. The semiconductor device according to claim 3, wherein
the inspection wiring contains aluminum.

12. The semiconductor device according to claim 3, wherein
the inspection wiring contains polysilicon.

13. The semiconductor device according to claim 9, further comprising
a protective film covering the inspection wiring except for the inspection pad.

14. The semiconductor device according to claim 3, wherein
the semiconductor element includes an Insulated Gate Bipolar Transistor (IGBT), a Metal-Oxide-Semiconductor Field-Effect Transistor (MOSFET), or a diode configured to control a current flowing between the rear surface electrode and a front surface electrode provided in the effective region on the front surface of the semiconductor substrate.

15. A method of manufacturing a semiconductor device, comprising the steps of:
preparing a semiconductor wafer including a plurality of chips arranged in a matrix on a front surface of the semiconductor substrate, each of the plurality of chips including an effective region including a semiconductor element and an ineffective region provided on a circumference of the effective region, the semiconductor wafer including a rear surface electrode on a rear surface of the semiconductor substrate;
forming inspection wiring in the ineffective region of the front surface of the semiconductor wafer in such a manner that a first end of the inspection wiring is in contact with a semiconductor layer which is provided in the ineffective region on the front surface of the semiconductor wafer and electrically connected to the rear surface electrode, and so as to surround an outer periphery of the effective region;
cutting the semiconductor wafer along a dicing line defined in the ineffective region between the plurality of chips adjacent to each other and outside of the inspection wiring with respect to the effective region thereby separating the plurality of chips into individual pieces; and
applying a voltage between the inspection wiring and the rear surface electrode of each of the plurality of chips to detect a current flowing between the inspection wiring and the rear surface electrode, thereby inspecting an electrical connection state between the inspection wiring and the rear surface electrode.

16. The method of manufacturing the semiconductor device according to claim 15, wherein
the inspection wiring includes an inspection pad at a second end connected to a wiring body extending from the first end,
a width of the inspection pad is wider than a width of the wiring body extending from the first end to the second end, and
inspection of an electrical connection state between the inspection wiring and the rear surface electrode is conducted by applying a voltage between the inspection pad and the rear surface electrode.

17. The method of manufacturing the semiconductor device according to claim 15, wherein
the inspection wiring is formed between a channel stopper provided on the outer periphery of the effective region and the dicing line.

18. The method of manufacturing the semiconductor device according to claim 15, wherein
a thickness of the inspection wiring is thinner than a thickness of wiring connected to the semiconductor element in the effective region.

19. The method of manufacturing the semiconductor device according to claim 15, wherein
the inspection wiring contains aluminum.

20. The method of manufacturing the semiconductor device according to claim 15, wherein
the inspection wiring contains polysilicon.

21. The method of manufacturing the semiconductor device according to claim 16, further comprising
forming a protective film covering the inspection wiring except for the inspection pad.

22. The method of manufacturing the semiconductor device according to claim 15, wherein
the semiconductor element includes an IGBT, a MOSFET or a diode configured to control a current flowing between the rear surface electrode and a front surface electrode provided in the effective region on the front surface of the semiconductor wafer.

* * * * *